(12) United States Patent
Kirbie et al.

(10) Patent No.: US 7,855,904 B2
(45) Date of Patent: Dec. 21, 2010

(54) APPARATUS FOR PRODUCING VOLTAGE AND CURRENT PULSES

(75) Inventors: Hugh Kirbie, Los Alamos, NM (US); Gregory E. Dale, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 243 days.

(21) Appl. No.: 11/377,468

(22) Filed: Mar. 16, 2006

(65) Prior Publication Data

US 2006/0245217 A1    Nov. 2, 2006

(51) Int. Cl.
*H02M 3/18*   (2006.01)
*H02M 7/00*   (2006.01)

(52) U.S. Cl. .................................... 363/60; 320/166
(58) Field of Classification Search .............. 363/60; 333/20; 307/106, 110; 320/166, 167
See application file for complete search history.

(56) References Cited

U.S. PATENT DOCUMENTS

| | | | | | |
|---|---|---|---|---|---|
| 5,568,035 | A | * | 10/1996 | Kato et al. | 320/166 |
| 5,635,776 | A | * | 6/1997 | Imi | 307/110 |
| 5,774,348 | A | * | 6/1998 | Druce et al. | 363/60 |
| 5,907,484 | A | * | 5/1999 | Kowshik et al. | 363/60 |
| 6,008,690 | A | * | 12/1999 | Takeshima et al. | 327/534 |
| 6,026,003 | A | * | 2/2000 | Moore et al. | 363/60 |
| 6,048,789 | A | * | 4/2000 | Vines et al. | 438/633 |
| 6,137,276 | A | * | 10/2000 | Rudolph | 323/282 |
| 2004/0080964 | A1 | * | 4/2004 | Buchmann | 363/60 |
| 2004/0240241 | A1 | * | 12/2004 | Chueh et al. | 363/60 |

OTHER PUBLICATIONS

A. Krasnykh, et al., "A Solid State Marx Type Modulator for Driving a TWT," Conference Record of the 24th International Power Modulator Symposium, 2000, p. 209.
K. Okamura et al., "Development of the High Repetitive Impulse Voltage Generator Using Semiconductor Switches," Proceedings of the 12th IEEE International Pulsed Power Conference, 1999, p. 807.
Marcel M.P. Gaudreau, et al., "Solid-State Pulsed Power Systems for the Next Linear Collider," Digest of Technical Papers for the Pulsed Power and Plasma Science Conference, PPPS-2001, 2001, p. 289.
Jeffrey A. Casey et al., "Solid-state Marx Bank Modulator for the Next Generation Linear Collider," Conference Record of the 26th International Power Modulator Symposium and 2004 High Voltage Workshop (PMC), San Francisco, California, May 23-26, 2004.

(Continued)

*Primary Examiner*—Edward Tso
*Assistant Examiner*—Arun Williams
(74) *Attorney, Agent, or Firm*—Mark N. Fitzgerald; Robert P. Santandrea; Samuel L. Borkowsky

(57) ABSTRACT

An apparatus having one or more modular stages for producing voltage and current pulses. Each module includes a diode charging means to charge a capacitive means that stores energy. One or more charging impedance means are connected to the diode charging means to provide a return current pathway. A solid-state switch discharge means, with current interruption capability, is connected to the capacitive means to discharge stored energy. Finally, a control means is provided to command the switching action of the solid-state switch discharge means.

13 Claims, 16 Drawing Sheets

OTHER PUBLICATIONS

R.J. Richter-Sand et al., "Marx-Stacked IGBT Modulators for High Voltage, High Power Applications," Conference Record of the 25$^{th}$ International Power Modulator Symposium and 2002 High Voltage Workshop (PMC), 2002, p. 390.

H. Kirbie et al., "An All Solid—State Pulse Power Source for High PRF Induction Accelerators," Conference Record of the 23$^{rd}$ International Power Modulator Symposium, 1998, p. 6.

* cited by examiner (a)

(b)

(a)

(b)

APPARATUS FOR PRODUCING VOLTAGE AND CURRENT PULSES

APPARATUS FOR PRODUCING VOLTAGE AND CURRENT PULSES

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to modulators, and, more particularly to a solid-state modulator.

BACKGROUND OF THE INVENTION

The traditional Marx generator, named for its inventor, Professor Erwin Marx, produces a single, high-voltage pulse by switching precharged capacitors into a series-connected string using gas-insulated spark gaps. The Marx generator is a rugged, low-impedance source of electrical energy that has served well in a wide variety of high-peak-power applications for the past 75 years.

Marx generators are now undergoing a renaissance of new applications with the use of modern solid-state switches. The use of solid state switches with current interruption capability in place of spark gaps, for example, gives simple Marx generators the ability to produce square-shaped output pulses at very high rates. Some examples of solid-state switches with current interruption capability include the Bipolar Junction Transistor (BJT), Field Effect Transistor (FET), and Insulated Gate Bipolar Transistor (IGBT), and Gate Turn Off (GTO). The current interruption capability of these switches also allows the output pulse to change width from one pulse to the next, a capability that gives the generator the ability to adapt rapidly to changing load requirements.

Currently, Marx generators using solid-state switches are unable to equal the high peak voltage and peak power capacity of generators using spark gaps, but the operational advantages gained in pulse control and high average power have transformed the single-shot Marx generator into a versatile modulator. The present invention embodies the next step in development of the solid-state Marx modulator, by replacing the usual inductive or resistive charging elements with fast-recovery diodes, as shown in FIGS. 1 and 2.

Krasnykh was the first to report using IGBT switches in a Marx-style modulator with resistive charging elements [A. Krasnykh, R. Akre, S. Gold, and R. Koontz, "A Solid-State Marx Type Modulator for Driving a TWT," Conference Record of the 24th International Power Modulator Symposium, 2000, p. 209.] Krasnykh also mentions the use of diodes to replace one of the two resistor charging strings. Okamura was the first to report using all diode-directed charging in a solid-state Marx switched by thyristors [K. Okamura, S. Kuroda, and M. Maeyama, "Development of the High Repetitive Impulse Voltage Generator Using Semiconductor Switches," Proceedings of the 12th IEEE International Pulsed Power Conference, 1999, p. 807.] The diodes route pulse-charging current from a command-resonant charging system to the energy-storage capacitors at rates up to 2 kHz. In this case, the thyristors have no current interruption capability and therefore do not offer pulse width selection.

Gaudreau and Casey describe an IGBT-switched Marx modulator design (for which they presented no test data) that uses diodes in place of charging elements [Marcel M. P. Gaudreau, et al., "Solid-State Pulsed Power Systems for the Next Linear Collider," Digest of Technical Papers for the Pulsed Power and Plasma Science Conference, PPPS-2001, 2001, p. 289.] The Gaudreau and Casey circuit design showed an internally distributed charging inductor in parallel with one of the diode strings. This arrangement does not recycle energy, and no mention was made of pulse shape control.

In a later publication, Casey described tests of an IGBT-switched Marx modulator that used common-mode isolation inductors as charging elements and a single string of free-wheeling diodes. The isolation inductors provided a low-impedance path for difference currents, such as charging or filament currents, and a high impedance path to common-mode currents during the Marx output pulse.

In a recent publication, Jeffery A. Casey, et al., (Abstract) "Solid-state Marx Bank Modulator for the Next Generation Linear Collider," Conference Record of the 26th International Power Modulator Symposium and 2004 High Voltage Workshop (PMC), San Francisco, Calif., May 23-26, 2004, Casey describes the ability of the freewheeling diodes to pass the load current around an inactive Marx stage. By doing so, additional stages may be added to the Marx assembly and fired at staggered intervals to compensate for the natural pulse droop. Modeling data indicates the efficacy of staggered stage switching, but no demonstration of staggered switching was provided. Richter-Sand also reported development of an IGBT-switched Marx modulator that used common-mode isolation inductors for charging and develops each stage voltage across a diode [R. J. Richter-Sand, et al., "Marx-Stacked IGBT Modulators for High Voltage, High Power Applications," Conference Record of the 25th International Power Modulator Symposium and 2002 High Voltage Workshop (PMC), 2002, p. 390]. However, as in the prior cases, no mention was made of pulse shape control or energy recovery.

Other researchers have elected to use pulse-forming networks (PFN) in place of simple capacitors to shape the Marx output pulse and thereby eliminate the need for opening switches or additional energy storage. Since no more energy is stored than is needed by a single pulse, the PFN assembly is very compact, but at the sacrifice of pulse flexibility.

Other researchers have developed non-Marx-type solid-state modulators with pulse-width and pulse-shape agility. These modulators, induction voltage adders (IVA), use transformers to sum potentials contributed by independent sources. The primary winding on each independent transformer is powered by a solid-state source. A secondary winding, common to all the transformers, collects the power from each independent source and algebraically sums their potentials. A major advantage of IVAs is that all the sources are controlled from the ground potential, with the transformer providing the high-voltage isolation.

Kirbie developed the first solid-state IVA to power induction accelerators. Cook and Watson developed a much faster IVA to power an electron-beam kicker, along with control methods for pulse-shape agility, [H. Kirbie, et al., (Invited) "An All Solid-State Pulse Power Source for High PRF Induction Accelerators," Conference Record of the 23rd International Power Modulator Symposium, 1998, p. 6]. Commercial IVAs are also available from First Point Scientific. All the IVAs require a transformer for each source, and the transformer includes magnetic core material that significantly increases assembly weight and, because of magnetic saturation, limits the maximum pulse width.

Most of the advantages of our Marx modulator come from our use of diodes as charging elements. While other researchers have used diodes as well as IGBTs in a variety of solid-state modulators, including Marx-style modulators, we believe no one has taken our approach or demonstrated similar benefits Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the purposes of the present invention, as embodied and broadly described herein, the present invention includes an apparatus having one or more modular stages for producing voltage and current pulses. Each module includes a diode charging means to charge a capacitive means that stores energy. One or more charging impedance means are connected to the diode charging means to provide a return current pathway. A solid-state switch discharge means, with current interruption capability, is connected to the capacitive means to discharge stored energy. Finally, a control means is provided to command the switching action of the solid-state switch discharge means.

BRIEF DESCRIPTION OF THE DRAWINGS

The accompanying drawings, which are incorporated in and form a part of the specification, illustrate the embodiment(s) of the present invention and, together with the description, serve to explain the principles of the invention. In the drawings.

DETAILED DESCRIPTION

The electrical architectural design used in the present invention diode-directed solid-state modulator yields the advantages of efficiency, wave-shape control, switch protection, power flow management, and size/weight reduction.

Figure 1:
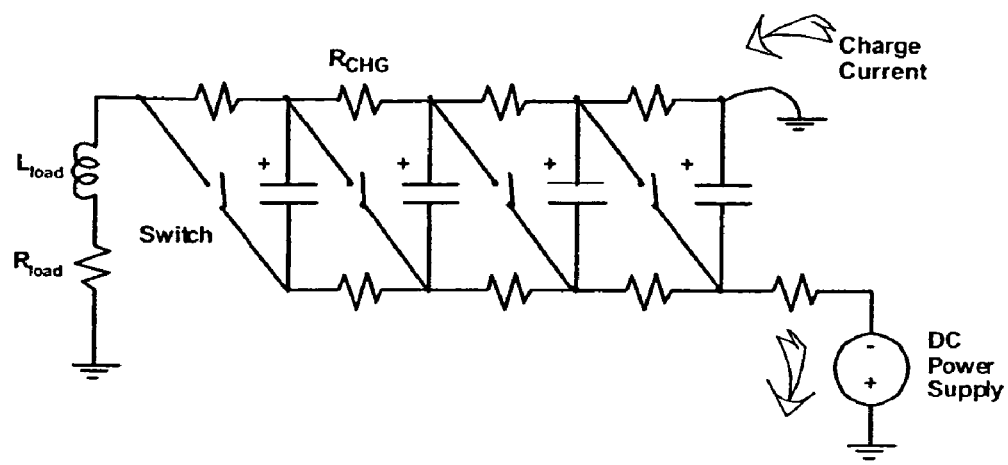
FIG. 1 is a simplified diagram of a four-stage Marx modulator with resistive charging elements
Figure 2:
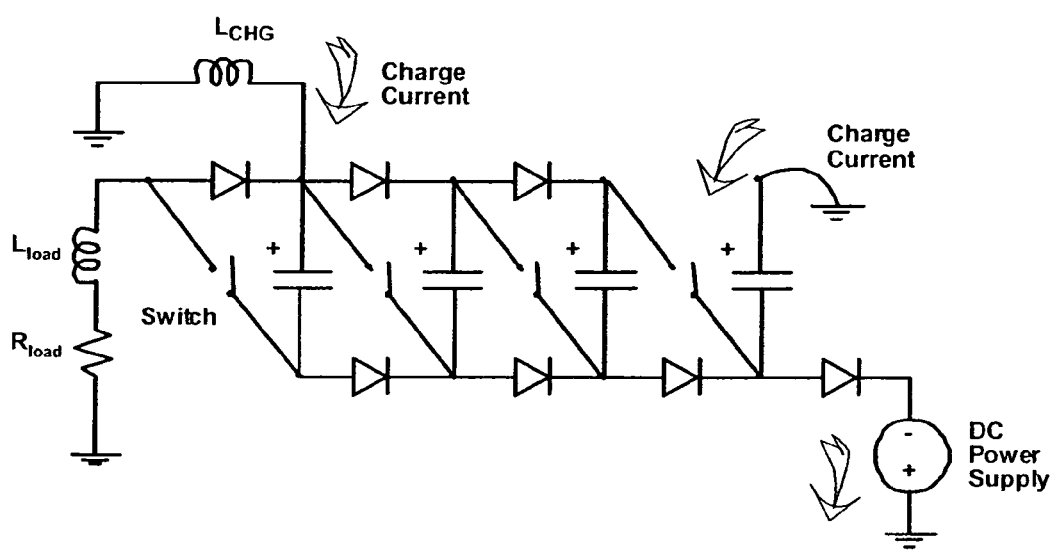
FIG. 2 is a simplified diagram of one embodiment of a four-stage Marx modulator with diode charging elements. The external charging impedance is sized to shunt no more than 10% of the load current at several times the maximum expected pulse width.

Referring now to FIG. 2, the use of diode charging elements allows the modulator to recycle energy that would otherwise be lost. When the IGBTs are closed, the diodes are reversed-biased during the output pulse, and, thus, consume very little of the pulse, regardless of its duration. When the IGBTs open, energy stored in the charging impedance (through the use of an inductor) is directed back to the energy storage capacitors through the diodes. The single charging inductor does siphon off a little of the Marx output pulse, but all this inductively stored energy is given back after each pulse. The dc power supply also uses the charging diodes to complete the recharging process by the same path; supply current enters the Marx circuit through the charging inductor, trickles through the Marx assembly via diode routing, and returns to the power supply near the grounded end. The diodes thus provide a low-loss, low-impedance path for the power-supply charging current between pulses and a high-current recovery path for inductively stored energy.

The modulator adds the new and powerful dimension of tailoring the output pulse for optimal performance at the load through the unique ability to operate each stage independently. Stages not receiving a switching command are bypassed by the charging diodes, an arrangement producing an output pulse voltage equal to the charge voltage times the number of active stages. Also, the independent stages can be switched on and off within a single pulse envelope to produce a digitally synthesized pulse shape.

The diode architecture that increases the Marx efficiency in the modulator also intercepts destructive transient energy and returns it safely to the energy-storage capacitors for reuse. The switches used in prior art Marx-type modulators are steadily increasing in peak and average power-handling capacity, but the drawback is their susceptibility to switch damage from energy transients, a problem that creates a reliability issue for potential customers. The traditional approach to addressing this problem is to absorb the incoming transient energy by connecting snubbing circuits in parallel with the endangered switches. The present invention approach provides a higher level of protection by directing transient energy around the vulnerable switches. This approach gives a higher level of protection and can eliminate the need for snubbing circuits entirely.

In developing the architecture of the present invention Marx modulator, there was a concerted focus on efficient, flexible power flow management. The diode-directed circuit architecture provides high shunt impedance to the outflow of power (when the diodes are off) and converts to very low shunt impedance to the inflow of power (when the diodes are on), regardless of whether that power comes from a dc power supply or a high-power transient. With a Marx modulator that provides for in/out power flow management under all conditions, the needs of the switches and customers for any load and any size of Marx assembly can be met.

The basic architecture of the modulator will allow it to keep pace with the demands of research, the military, and industry for high-peak and high-average-power sources in ever-smaller and ever-lighter packages. The present invention Marx modulator does not use a large, heavy transformer to produce high voltage. Moreover, since all charging, switching, and gate-control components are solid-state, the purchase of silicon interiors (dies) instead of encapsulated components is now an option. Therefore, each Marx stage can be made very small and light, either by combining the dies in a multi-chip module or combining their functions within a single application-specific integrated circuit (ASIC). This possibility leaves the volume of the energy storage capacitors as the dominant factor determining the dimensions. Since the history of capacitor technology demonstrates steadily increasing energy density, in the future it is likely that even a further reduction in size of Marx modulators is feasible.

Further, the use of all-solid-state construction in a Marx modulator has the added benefit of minimizing the heat generated during operation, a result that allows reduction in the size and complexity of the attendant cooling system. In one embodiment of the present invention, the relatively low output voltage allowed a reduction in weight through the use of sulfur hexafluoride gas ($SF_6$) for the insulating and cooling medium.

The present invention Marx modulator was developed to fill the power-source needs of several applications, each possessing its own set of parameters for weight, size, output voltage, current, pulse width, repetition rate, and average power. The first of these applications was a compact, gas-insulated power source designed to deliver a 46-kV, square-shaped pulse to the cathode of a magnetron.

The S-band magnetron is an EV2 Technologies® Model 6028 that exhibited the following performance parameters:

TABLE 1

| Operating parameters for model 6028 magnetron | |
|---|---|
| Voltage | 46 kV |
| Current | 160 A |
| Pulse width | 5 μs |
| Magnetic field | 150 mT |
| Energy per pulse | 36.8 J |
| RF peak power | ~3.5 MW |
| Rate of voltage rise | <130 kV/μs |
| Average power limit | 7 kW (input) |

The magnetron operating point described above produces a nominal load impedance of 288 Ohms and requires a pulse that is reasonably flat (<1%) when averaged over the pulse width. The modulator is designed to obtain the pulse flatness by storing about 15 times the energy needed by a single pulse and using either a passive droop compensation network or active compensation by wave-shape control.

The IXYS® model IXBT42N170 was selected for the surface-mount switch because it exhibits a good compromise between operating voltage, pulsed current, and commutation speed. The IXYS® model DSDI60 fast-recovery diode was chosen for the charging elements, and a self-healing film capacitor was chosen from Aerovox® for energy storage. These key component decisions determined the remaining Marx modulator parameters shown in Table 2:

TABLE 2

| Marx modulator parameters. | |
|---|---|
| Max. stage voltage | 1200 V |
| Number of stages | 48 (57.6 kV open circuit) |
| Capacitance per stage | 16 μF |
| Total Marx capacitance | 786 μF |
| Max. stored energy | 553 J |
| Erected capacitance | 333 nF |
| Uncompensated droop | ~5% |

Figure 3:
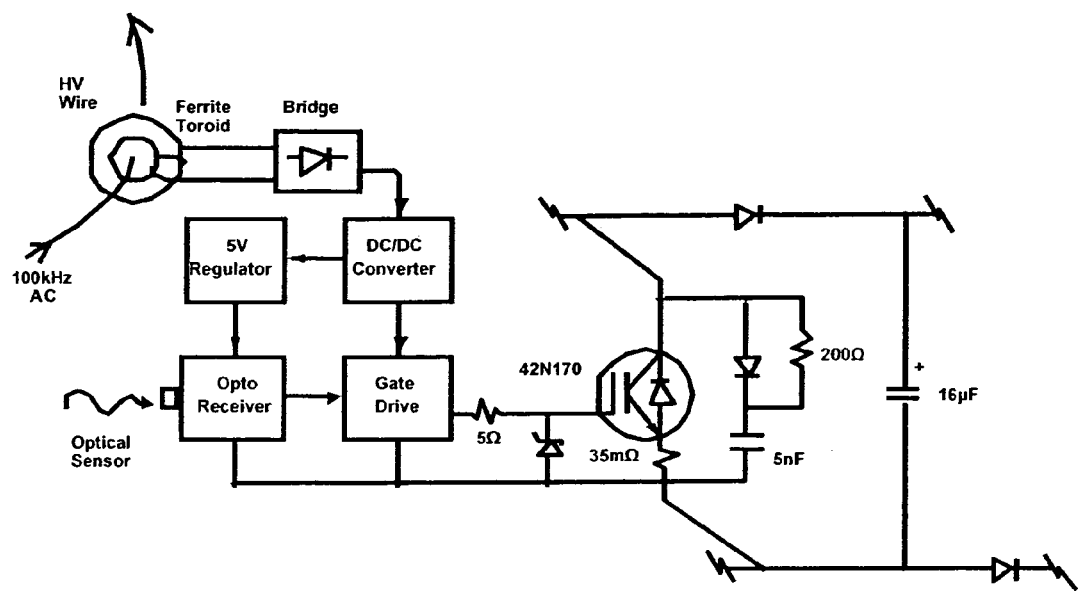
FIG. 3 is a schematic illustration of a single Marx stage switched with an IGBT that includes one method of triggering with fiber optic control.

Each stage consists of a single IGBT, two 8-μF capacitors connected in parallel, two fast-recovery diodes, a single gate driver, an optical interface, and an isolated power supply deriving its energy from a ferrite isolation transformer. The IGBT and gate-control elements are shown in FIG. 3.

Four Marx stages were collected on a single circuit board measuring 12.7 cm×30.5 cm, with each stage powered by a separate winding on a common ferrite transformer core. Consequently, each circuit board received four optical signal fibers and a single high-voltage wire serving as the primary winding for the ferrite transformer. The primary winding was powered from an H-bridge power converter operating at 100 kHz. For applications requiring an output voltage much greater than 75 kV, stage power may be acquired from the locally available charge voltage or delivered optically.

In one embodiment, the present invention Marx modulator comprised twelve of these circuit boards, racked-mounted on rails in a folded arrangement that saves space. The centers of each ferrite transformer shared a common axis to facilitate threading the primary winding through the 12 boards. The boards were supported on the assembly rails by modified edge connectors. The circuit board assembly weighed 11 kg, measures 76.2 cm×30.5 cm×17.8 cm.

Figure 4:
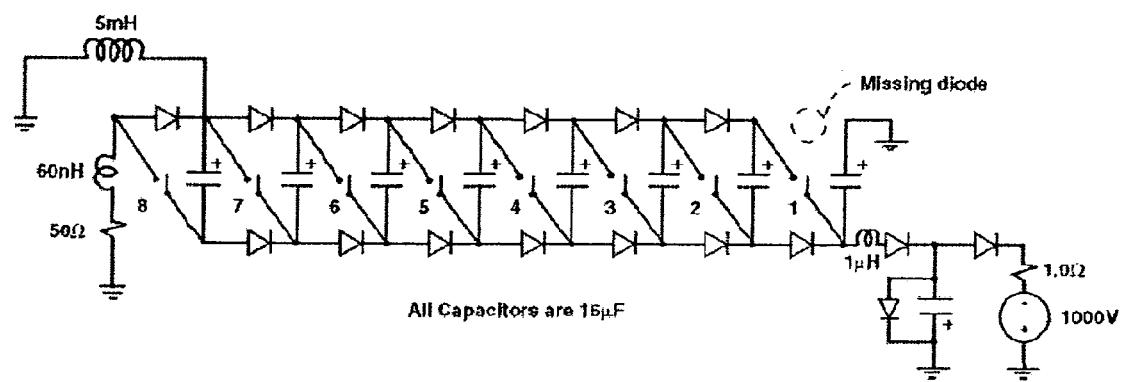
FIG. 4 is a diagram of one embodiment of an eight-stage Marx modulator example with idealized switches connected to a scaled load and charging impedance. The modulator simulations produce current levels comparable to those of the full-scale modulator.

FIG. 4 is a diagram of one embodiment of an eight-stage Marx modulator example with idealized switches connected to a scaled load and charging impedance. The modulator simulations produce current levels comparable to those of the full-scale modulator.

Figure 5:
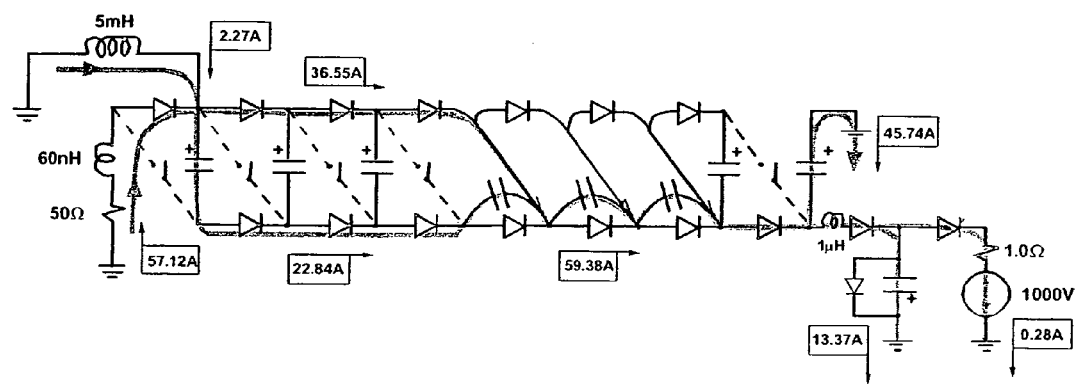
FIG. 5 is a diagram of the same idealized Marx modulator with three of the eight switches closed. Shaded arrows highlight the current path. Current makes its way to the load through the diode-directed path to produce an output pulse equal to three times the charge voltage. Current values are from Microcap-8 simulation results and provide a snapshot of the current flow taken 4-μs into the pulse.

FIG. 5 is a diagram of the same idealized Marx modulator with three of the eight switches closed. Shaded arrows highlight the current path. Current makes its way to the load through the diode-directed path to produce an output pulse equal to three times the charge voltage. Current values are from Microcap-8 simulation results and provide a snapshot of the current flow taken 4-µs into the pulse.

Figure 6:
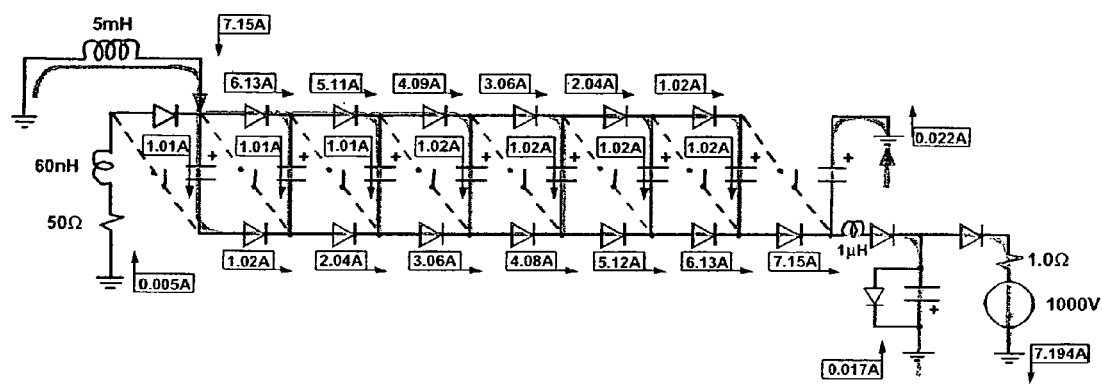
FIG. 6 is a diagram of an eight-stage Marx modulator with shaded arrows showing the path of the charging impedance current as it circulates through the Marx modulator. Flagged arrows depict current values from a Microcap-8 simulation and sampled 295-μs after the switches are open. Initial charging impedance current is established with a charge of 1000 V and a 5-μs closure for all switches.

FIG. 6 is a diagram of an eight-stage Marx modulator with shaded arrows showing the path of the charging impedance current as it circulates through the Marx modulator. Flagged arrows depict current values from a Microcap-8 simulation and sampled 295-µs after the switches are open. Initial charging impedance current is established with a charge of 1000 V and a 5-µs closure for all switches.

As noted above, the three key operational features provided by the present invention Marx modulator are digitally derived pulse-shape synthesis, energy recovery, and transient switch protection. The energy recovery and transient switch protection features are related in that both depend upon the diodes to quickly direct incoming power to the energy-storage capacitors. From an efficiency perspective, returning energy stored in the charging inductor back to the capacitors is good recycling strategy. From a switch-protection perspective, returning energy stored in an inductively dominated short circuit back to the capacitors forces the recovering switch potential to equal the charge voltage on each capacitor.

EXAMPLE

Figure 7:
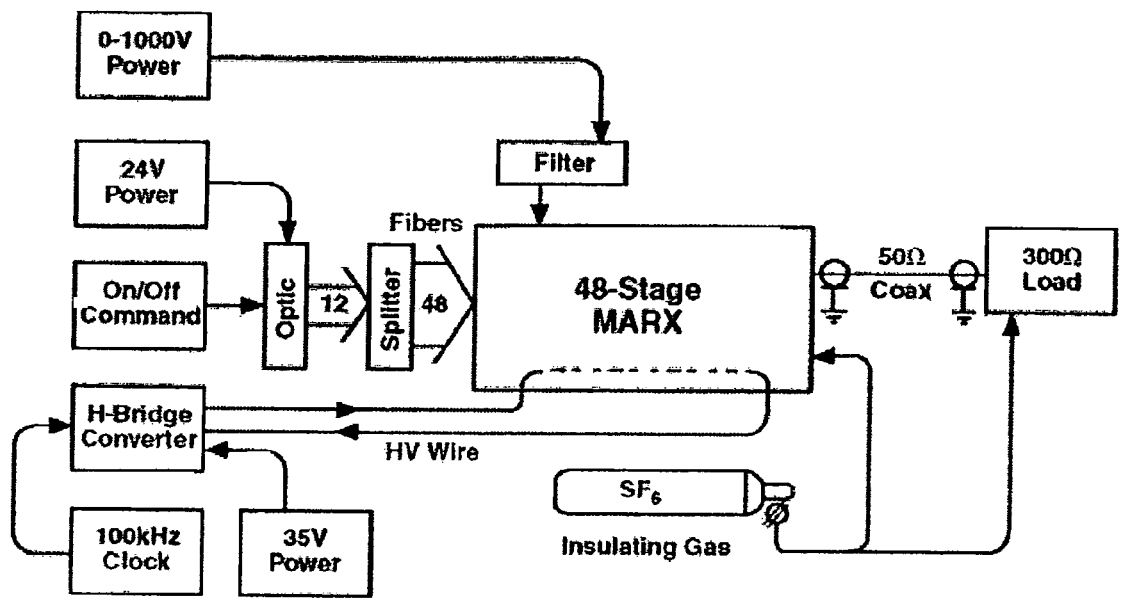
FIG. 7 is a block diagram of the test setup showing the Marx modulator, load assembly, optical signal interface, and power supplies.
Figure 8A:
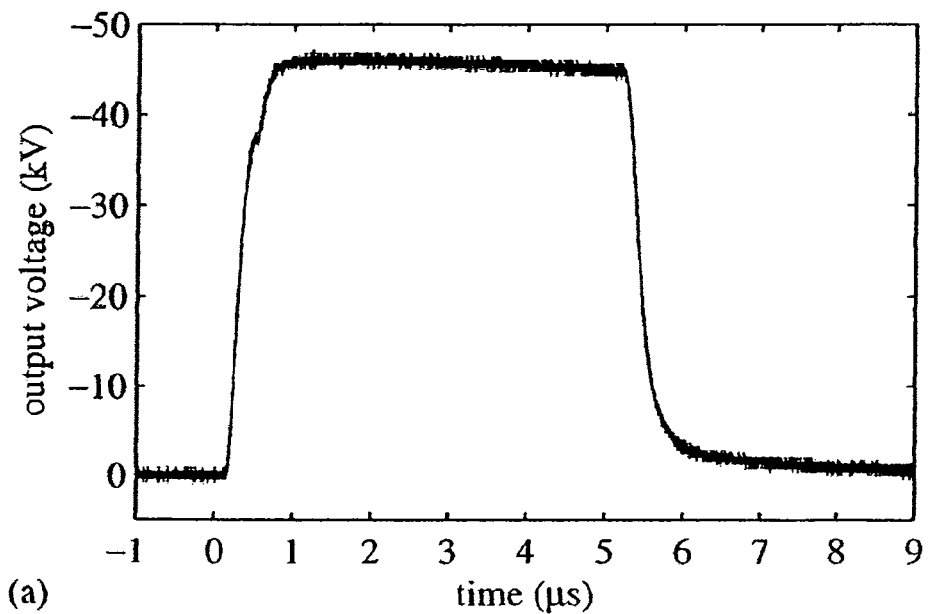
FIGS. 8a and 8b present data for an uncompensated pulse into the 300 Ω load. As tests continue, we will use the pulse-shape control features of the Marx to reduce pulse droop and tailor voltage rise time for optimum magnetron performance Nominal pulse characteristics are listed in Table 3.
Figure 8B:
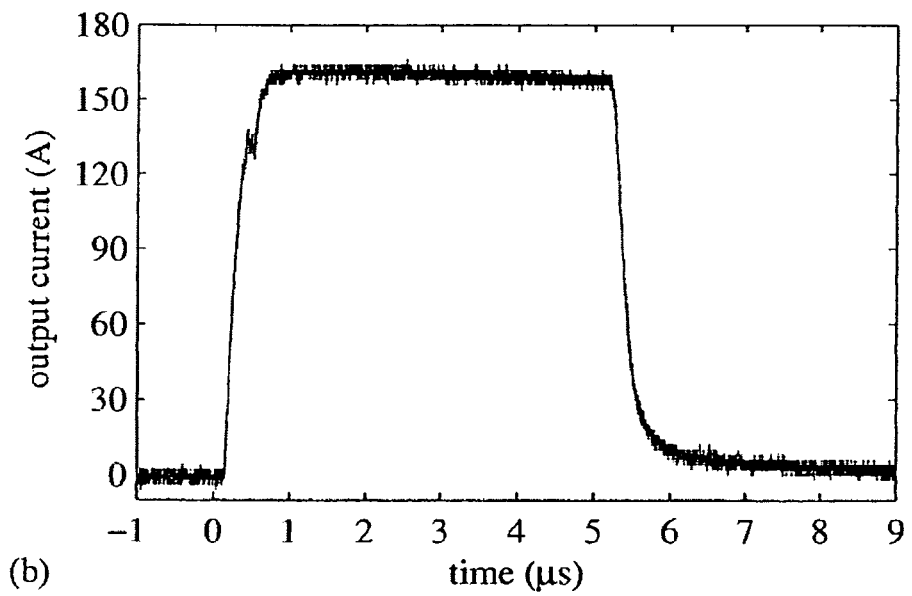
Figure 9A:
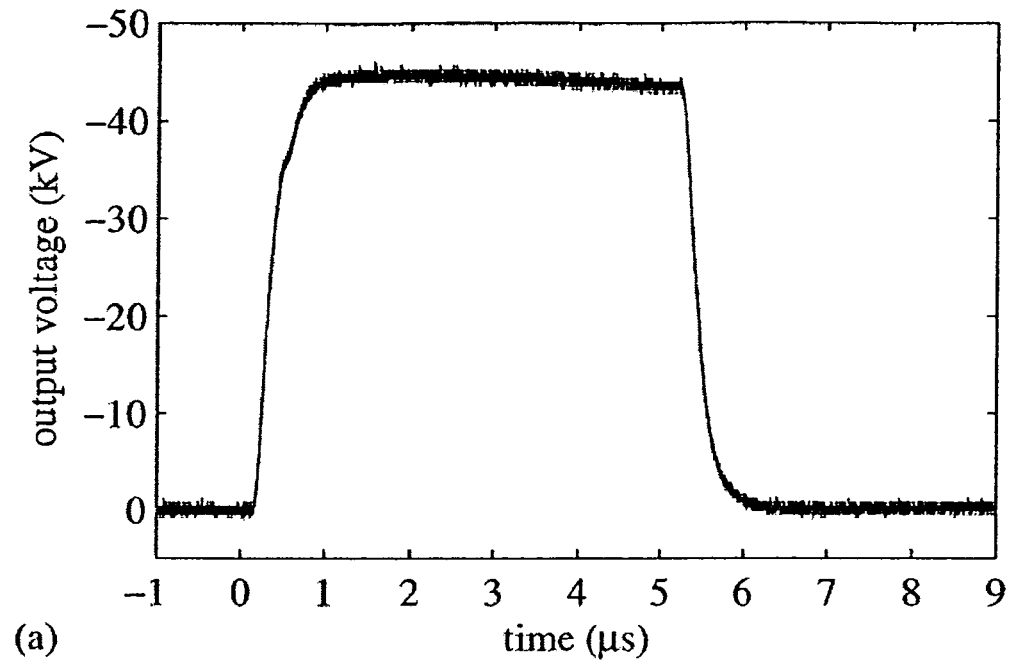
FIGS. 9a and 9b show fifty-hertz data showing voltage and current at the load for a 5-μs pulse, respectively. Initial charge voltage is 1000 V.
Figure 9B:
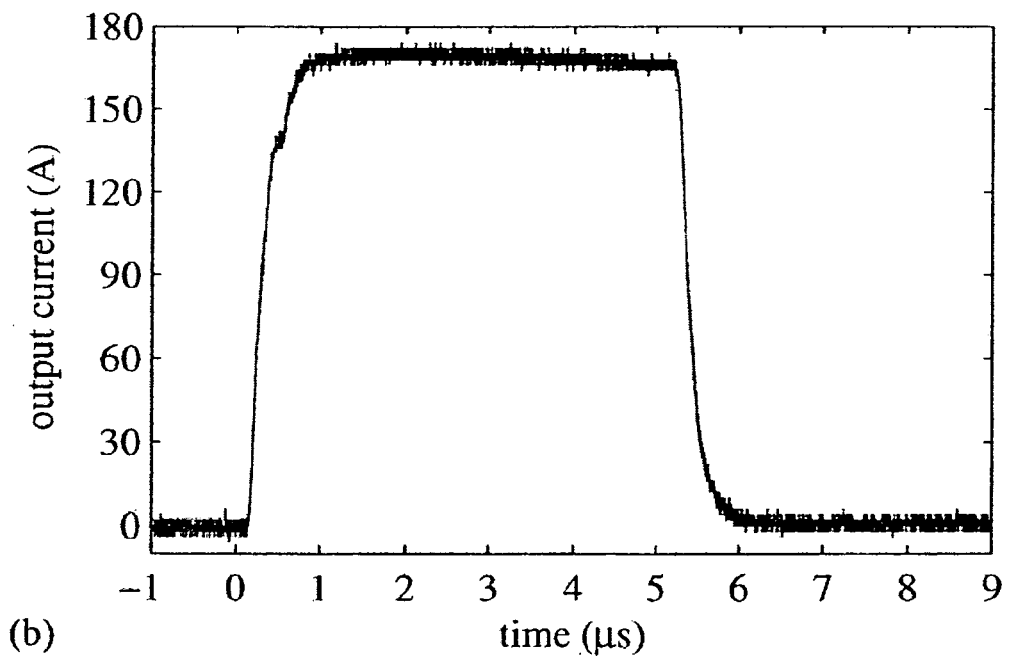

A test was completed using a full 48-stage Marx modulator connected to a 300 Ω resistive load. FIG. 7 shows the connections between the modulator and the support equipment. The load is a coaxial assembly consisting of a stack of 20 Ω annular resistors totaling 300 Ω. Both the load and Marx enclosure are insulated with $SF_6$ gas. Positioned next to the resistor stack is a long insulated brass rod with a sharp tip. The rod provides the means for an adjustable spark gap to simulate the random sparking of a malfunctioning magnetron.

FIGS. 8a, 8b, 9a, and 9b present data for an uncompensated pulse into the 300 Ω load. Note that the pulse-shape control features of the present invention provide the ability to reduce pulse droop and tailor voltage rise time for optimum magnetron performance. Nominal pulse characteristics are listed in Table 3:

TABLE 3 nominal pulse characteristics.

| | |
|---|---|
| Pulse duration | 5 µs |
| Rise time | 410 ns |
| Fall time | 400 ns |
| Peak voltage | 45 kV |
| Peak current | 165 A |
| Peak power | 7.4 MW |
| Pulse energy | 37 J |
| Pulse droop | 3.8% |

Figure 10A:
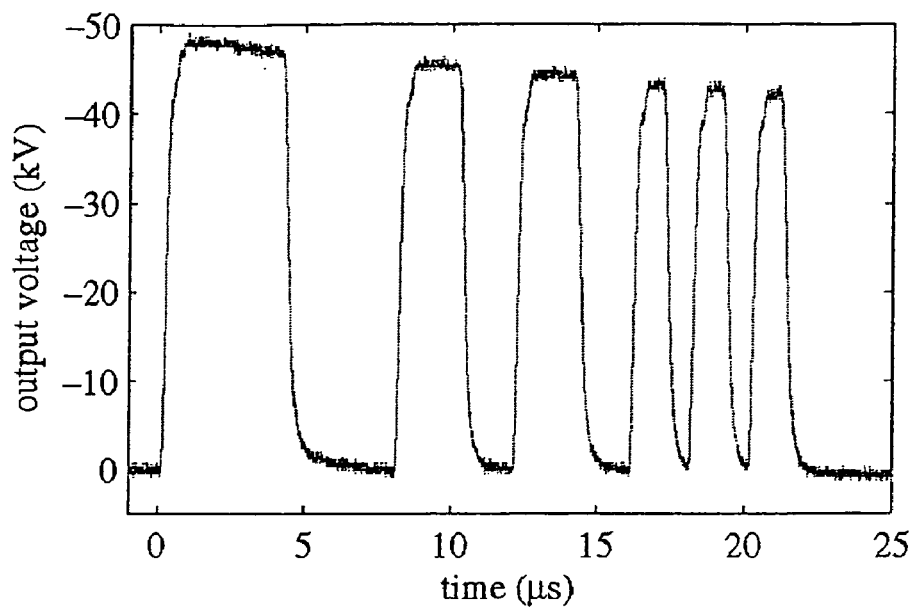
FIGS. 10a and 10b show a burst of six pulses: one 4-μs pulse; two at 2 μs; and three at 1 μs. Relative pulse positions maintain a 50% duty factor. Initial charge voltage is 1000 V.
Figure 10B:
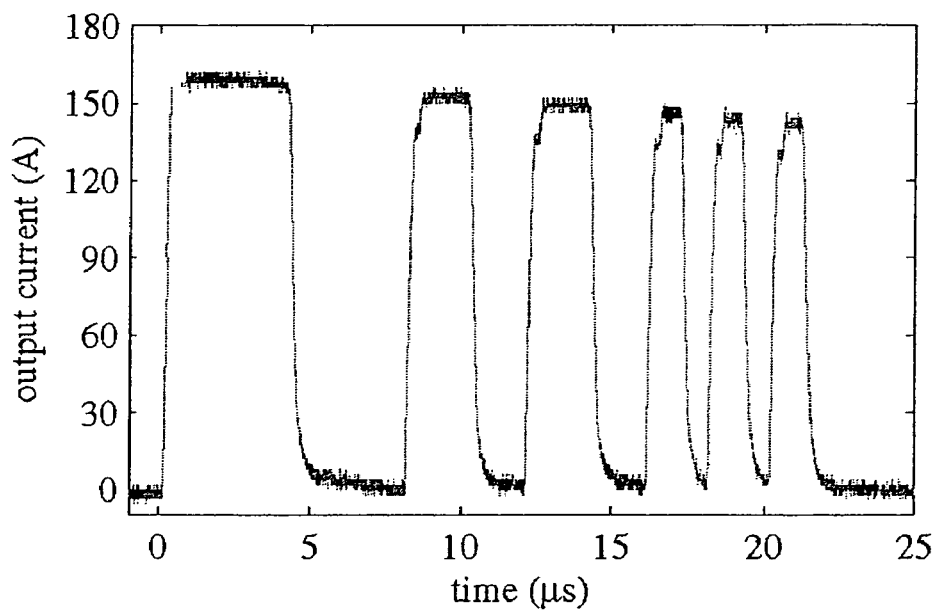
Figures 11A, 11B, 11C:
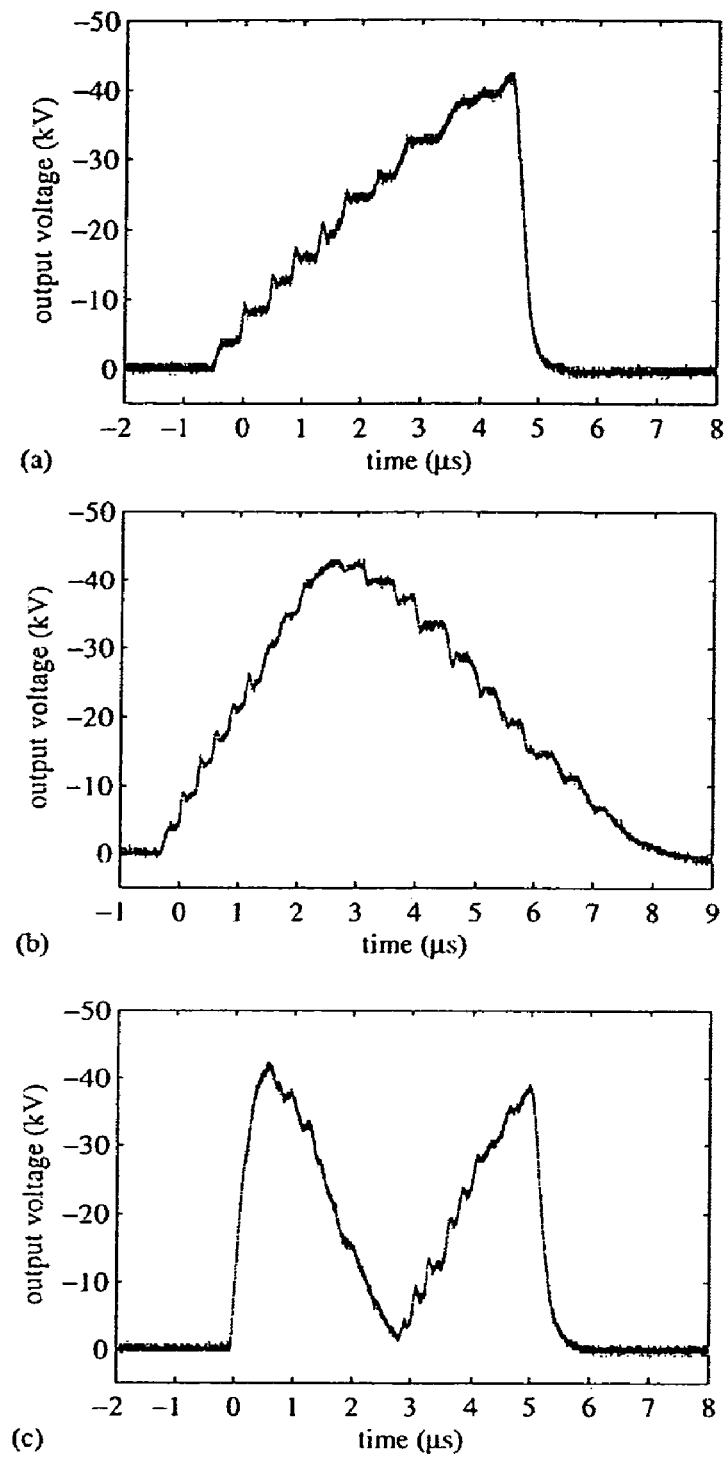
FIGS. 11a, 11b and 11c show output voltage pulse for ramp, triangle, and inverted triangle, respectively. Initial charge voltage is 1000 V for all three cases. Each shape consists of 12 control increments. For the triangle, the turn-on commands are separated by ~200 ns, and the turn-off commands are separated by ~400 ns.

FIGS. 10a and 10b show the pulse width and spacing (or duty factor) flexibility of the present invention modulator. A significant feature is the ability to radically change the output pulse shape with digital precision. For this demonstration three control waveforms were selected to exhibit full-scale changes in output pulse shape: a ramp, a triangle, and an inverted triangle. FIGS. 11a, 11b, and 11c display the results.

The pulse amplitude agility illustrated in FIGS. 11a, 11b, and 11c are obtained by switching individual Marx modulator boards on and off to produce any desired pulse shape with 12-step resolution. The boards respond to optical signals from a Silicon Laboratories Model C8051F12x-DK microcontroller unit (MCU). The Silicon Labs development kit includes an integrated development environment (IDE) that uses control programs written in the programming language C or in 8051 assembly language.

Figure 12:
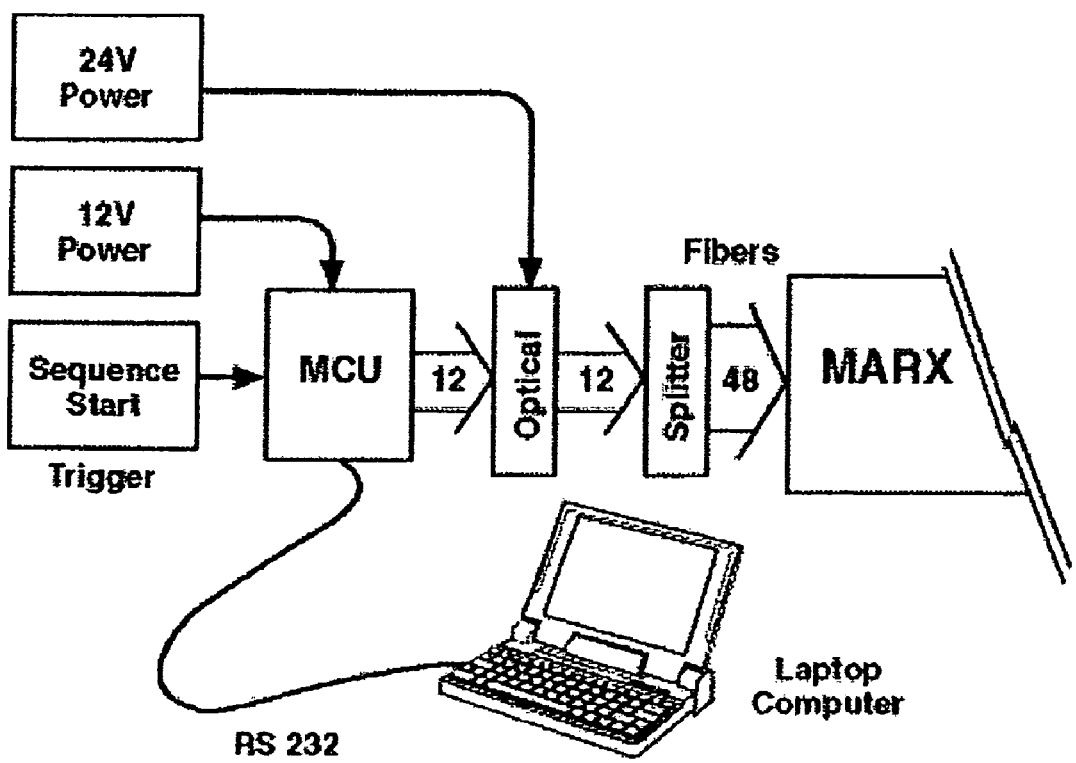
FIG. 12 is an Illustration of the computer, controller, and Marx interconnections. This articulated interface replaces the optical signal interface shown in FIG. 7.

The control program was loaded into the controller from a laptop computer, as shown in FIG. 12. A trigger generator executes the program that directs the generation of 12 electrical pulses with prescribed durations. These electrical pulses were converted to optical signals, with each optical signal then split four ways for routing to the 12 circuit boards The controller in one embodiment of the modulator uses serial communication, but USB and Ethernet links enabling real-time optimization are also possible. Our simple controller limits the Marx repetition rate to about 50 kHz for shaped pulses.

Figure 13A:
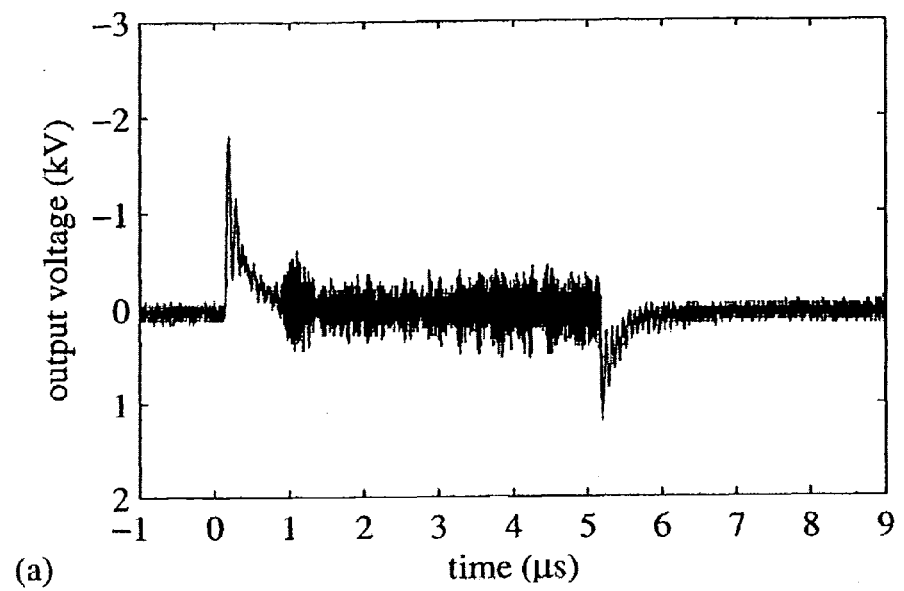
FIGS. 13a and 13b are voltage and current for a shorted load. The voltage (a) is measured at the Marx output port and the shorted current (b) passes through the load-shorting spark gap rod with the gap adjusted to zero. Initial charge voltage is 1000 V.
Figure 13B:
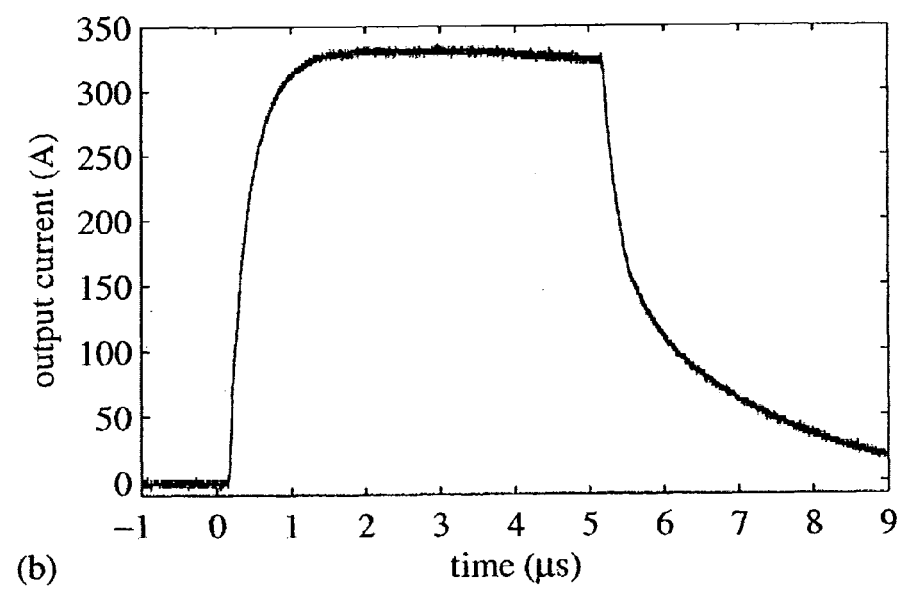
Figure 14A:
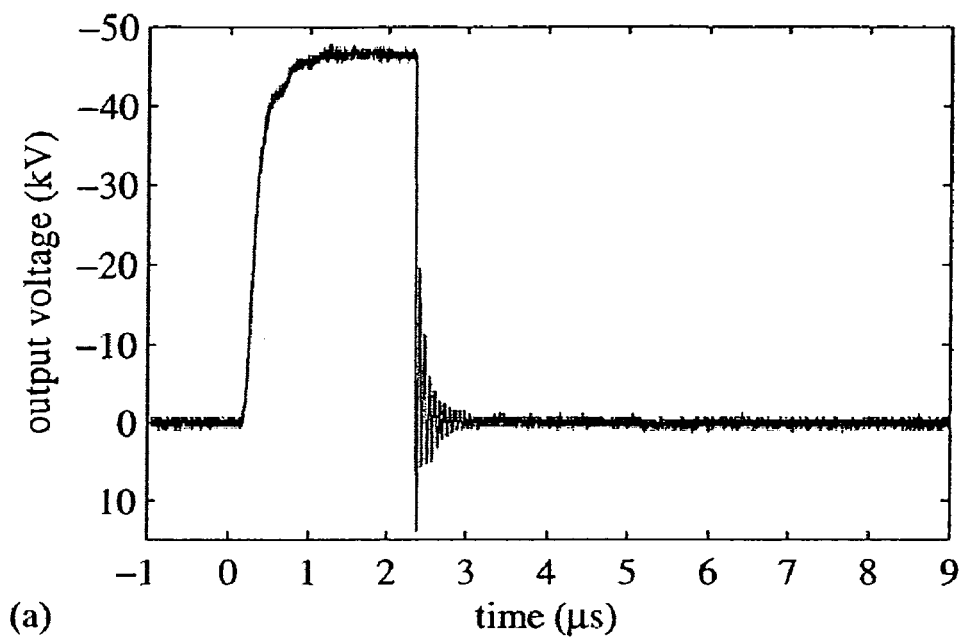
FIGS. 14a and 14b show the load-shorting spark gap is adjusted to create a short circuit during the pulse. After the spark is established, the current is quickly limited by emitter feedback to the value depicted in FIGS. 13a and 13b. Initial charge voltage is 1000 V.
Figure 14B:
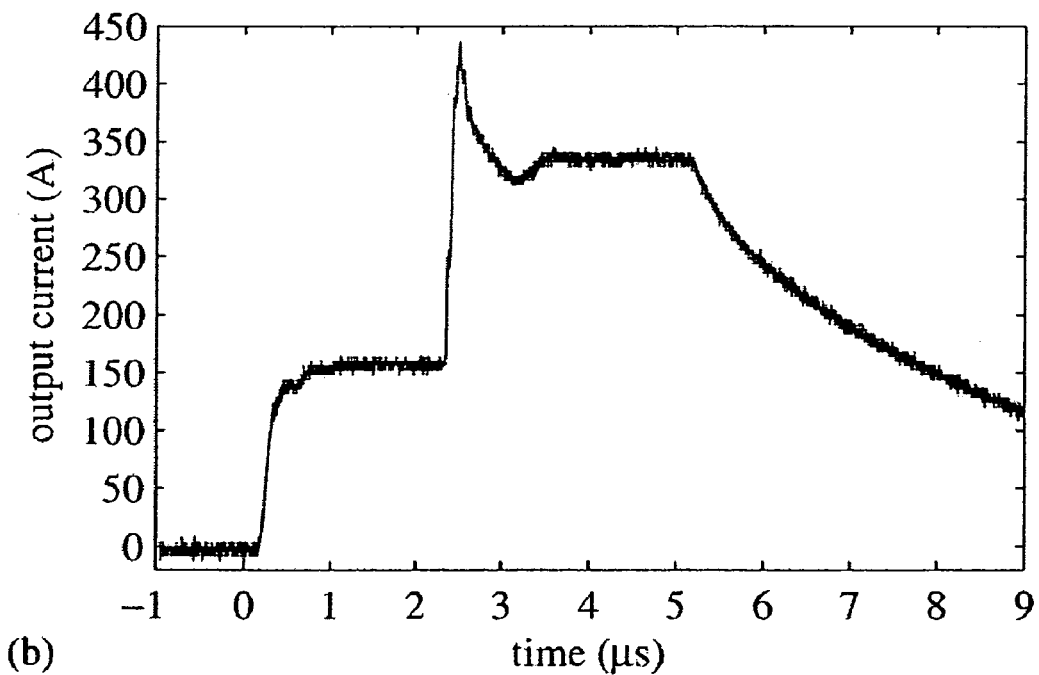

FIGS. 13 a, b and 14 a, b demonstrate the circuit protection features of one embodiment of the present invention modulator. In this embodiment, the modulator uses current limiting to minimize damage to a shorted load. Each IGBT has an emitter-feedback resistor that reduces the gate voltage during a short circuit and thereby limits the fault current to less than twice the normal operating current. The modulator protects itself by directing short-circuit current back to the energy-storage capacitors as the switches open. Two shorting cases are illustrated, first In FIGS. 13a and 13b, a short circuit is present from the beginning of the pulse. In FIGS. 14a and 14b, a short circuit is created by random spark gap closure sometime during the pulse. The gap closure simulates a sparking short circuit in a magnetron load. A 2 Ω resistor and 5-µH inductor were inserted in series with the load for this one test.

The diode-directed solid-state Marx modulator has a unique switch protection capability defined herein as "self-snubbering". The diode-charging rails, working in concert with the stage capacitors, can be used to form a very large capacitor-diode snubber around each switch to protect the switches from transient voltages. This arrangement has significant advantages over the typical resistor-capacitor-diode (RCD) snubber switch protection scheme. First, an RCD snubber dissipates transient energy through a resistor, while self-snubbering recycles this energy into the stage capacitors for use in the next pulse. Second, the capacitor of an RCD snubber has its capacitance limited by the need to meet the anticipated magnitude of the transient, while self-snubbering stores the transient energy in the stage capacitors, which can store orders-of-magnitude more transient energy than capacitors practical for an RCD snubber. Third, an RCD snubber requires extra components and takes up board space, while self-snubbering protection is inherent to the architecture of a diode-charged solid-state Marx modulator.

Figure 15:
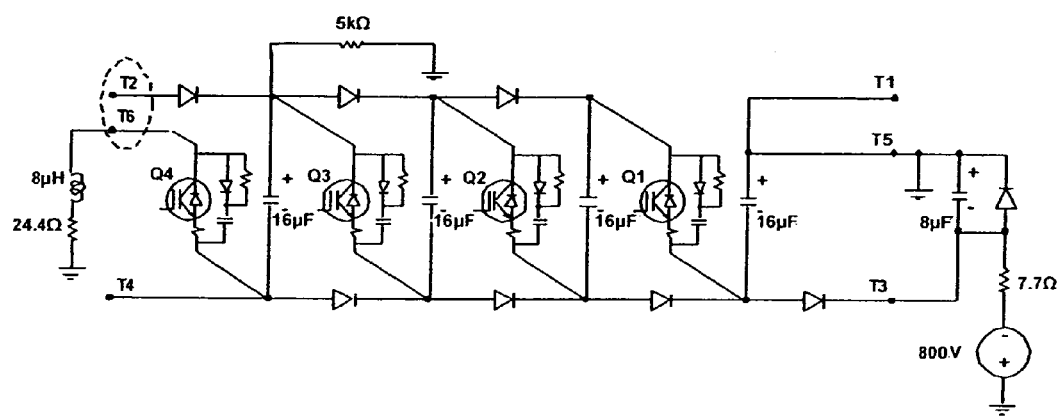
FIG. 15 is a schematic of self-snubbering test apparatus.

The effect of self-snubbering can be demonstrated by firing a single solid-state diode-charged Marx board into an inductive load. A schematic of the test setup is shown in FIG. 15. Replacing the charging inductor with a 5-kΩ charging resistor to isolate the effect of load inductance on the last stage switch modified the charging impedance. The load, consisting of several wire-wound resistors totaling 24.4 Ohms, has an inductance of about 8 µH. In addition to self-snubbering, each switch has RCD snubber protection, using a 5-nF capacitor and a 200 Ω resistor. The self-snubbering protection of the last stage switch can be removed by disconnecting output terminals T2 and T6, as shown in the schematic.

Figure 16A:
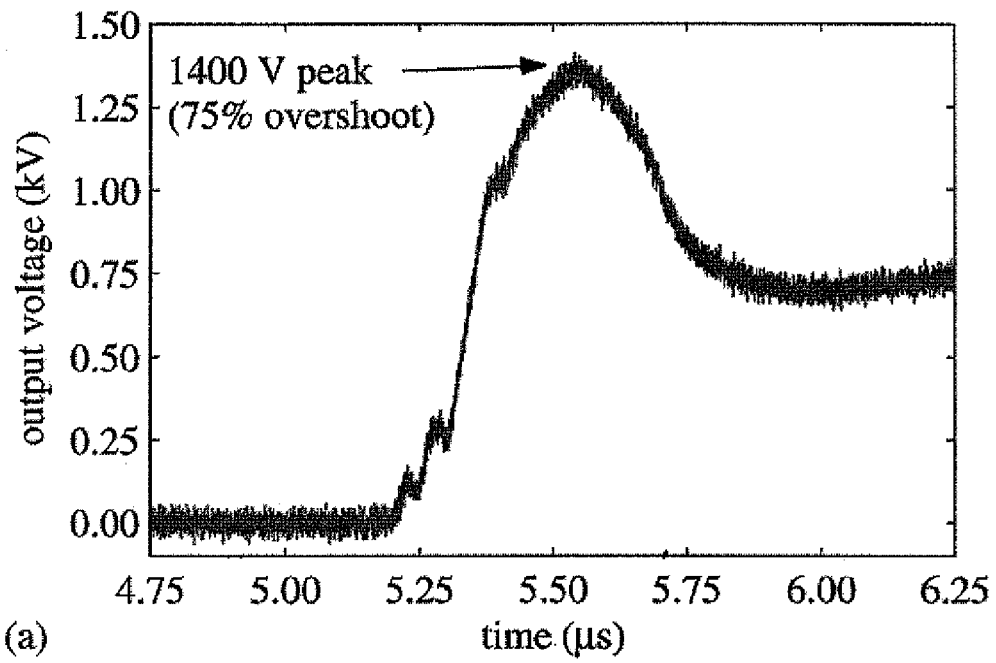
FIGS. 16a and 16b show voltage overshoot for circuit without self-snubbering, and voltage overshoot for circuit with self-snubbering, respectively.

FIG. 16a shows collector-to-emitter voltage across the last stage switch Q4 during turn-off with self-snubbering removed (T2 and T6 disconnected). The charging voltage for this test was 800 V. Even with RCD snubber protection, the voltage transient across the last switch rises to 1400 V, a 75% voltage overshoot. This will exceed the 1700-V rating of the switch at the full charge voltage of 1000 V and cause switch failure.

Figure 16B:
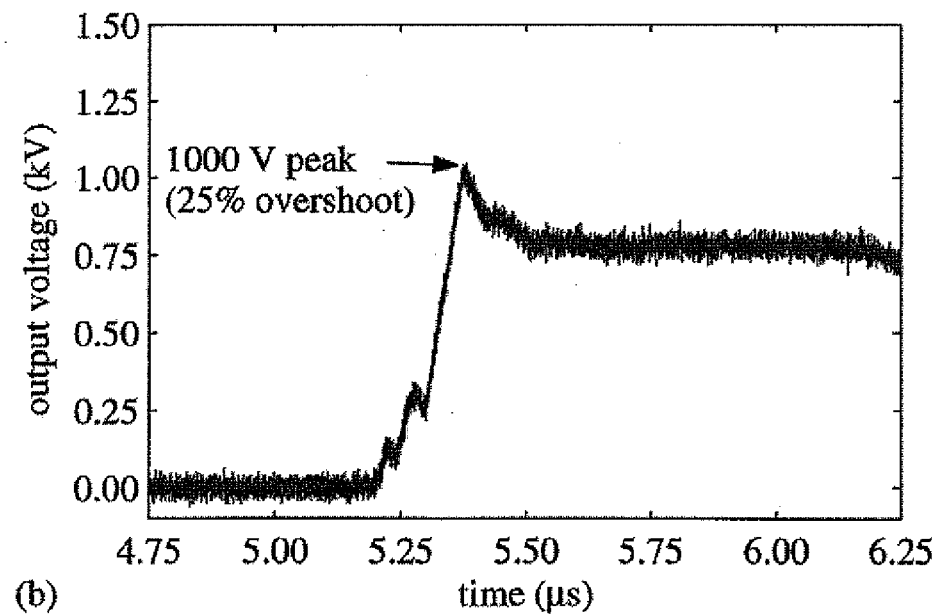

FIG. 16b shows the collector-to-emitter voltage across the last-stage switch Q4 during turn-off with self-snubbering employed (T2 and T6 connected). The charging voltage for this test was also 800 V. Self-snubbering has limited the voltage transient across the switch to 1000 V, a 25% overshoot. The majority of the voltage transient has been routed around the last switch, through the charging diode, and recycled into the stage capacitor for use in the next pulse. Self-snubbering is so effective that operation of single boards at high prf with the RCD snubbers completely removed with no adverse consequences has been made possible. Self-snubbering provides a tremendous advantage in switch protection and is offered only by the present invention solid-state, diode-charged Marx modulator.

The foregoing description of the invention has been presented for purposes of illustration and description and is not intended to be exhaustive or to limit the invention to the precise form disclosed, and obviously many modifications and variations are possible in light of the above teaching.

The embodiment(s) were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for producing voltage and current pulses, comprising:
   a modular stage consisting essentially of a capacitive energy storage means to store energy, a diode charging means connected to said capacitive energy storage means to charge said capacitive energy storage means, and a solid-state switch discharge means with current interruption capability connected to said diode charging means and to said capacitive energy storage means to discharge said stored energy;
   control means to command the switching action of said solid state switch discharge means;
   a power supply connected to said diode charging means of said modular stage; and
   impedance means connected to said diode charging means to provide a return current pathway for said power supply.

2. The apparatus in claim 1 where said capacitive energy storage means is selected from the group consisting of: a single capacitor, capacitors in series, capacitors in parallel, and capacitors in a series-parallel arrangement.

3. The apparatus in claim 1 where said solid-state switch discharge means is selected from the group consisting of: a single solid-state switch, solid-state switches in series, solid-state switches in parallel, and solid-state switches in a series-parallel arrangement.

4. The apparatus in claim 1 where said diode charging means comprise one or more power supplies connected to a diode charging network.

5. The apparatus in claim 1 where said impedance means is selected from the group consisting of an inductor and a resistor.

6. The apparatus in claim 1, additionally comprising a protection circuitry to protect said solid-state switching means from voltage transients.

7. The apparatus in claim 1, additionally comprising dump resistors for safely discharging energy from said capacitive energy storage means.

8. The apparatus in claim 1, where one or more diodes are removed from said diode charging means to facilitate rerouting of inductively stored energy into said capacitive energy storage means.

9. A method for power flow management, comprising:
   a. charging a capacitive means through a diode charging means,
   b. storing energy in said capacitive means,
   c. discharging energy from said capacitive means using a solid-state switch discharge means with current interruption capability, and
   d. controlling said solid-state switch discharge means to shape power pulse output.

10. The method in claim 9, comprising the additional step of protecting said solid-state switch discharge means from energy transients using a diode charging network.

11. The method in claim 9, comprising the additional step of rerouting transient and inductively stored energy around said solid-state discharge means into said capacitive means.

12. The method in claim 9, comprising the additional step of optimizing a power pulse output using feedback circuitry.

13. The method in claim 9, comprising the additional step of discharging said capacitive means through dump resistors.

* * * * *